(12) United States Patent
Prager et al.

(10) Patent No.: US 11,108,384 B2
(45) Date of Patent: Aug. 31, 2021

(54) NONLINEAR TRANSMISSION LINE HIGH VOLTAGE PULSE SHARPENING WITH ENERGY RECOVERY

(71) Applicant: Eagle Harbor Technologies, Inc., Seattle, WA (US)

(72) Inventors: James R. Prager, Seattle, WA (US); Timothy M. Ziemba, Bainbridge Island, WA (US); Chris Bowman, Seattle, WA (US); Kenneth E. Miller, Seattle, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 17/033,175

(22) Filed: Sep. 25, 2020

(65) Prior Publication Data

US 2021/0091759 A1    Mar. 25, 2021

Related U.S. Application Data

(60) Provisional application No. 62/905,504, filed on Sep. 25, 2019.

(51) Int. Cl.
*H03H 11/02* (2006.01)
*H03K 5/12* (2006.01)

(52) U.S. Cl.
CPC .............. *H03K 5/12* (2013.01); *H03H 11/02* (2013.01)

(58) Field of Classification Search
CPC ................................. H03H 11/02; H03K 5/12

USPC .......................................................... 327/170
See application file for complete search history.

(56) References Cited

U.S. PATENT DOCUMENTS

| 6,362,604 B1 | 3/2002 | Cravey | |
| 2010/0007426 A1* | 1/2010 | Ricketts | .................. H03L 7/099 |
| | | | 331/107 T |
| 2015/0318846 A1 | 11/2015 | Prager et al. | |
| 2018/0102769 A1 | 4/2018 | Prager et al. | |
| 2018/0102770 A1* | 4/2018 | Prager | ...................... H03K 5/12 |
| 2018/0331655 A1 | 11/2018 | Prager et al. | |

OTHER PUBLICATIONS

International Search Report and Written Opinion as issued in connection with International Patent Application No. PCT US2020/052817, dated Nov. 30, 2020, 9 pages.

* cited by examiner

*Primary Examiner* — William Hernandez
(74) *Attorney, Agent, or Firm* — Sanders IP Law

(57) ABSTRACT

Some embodiments include a nonlinear transmission line system comprising: a power supply providing voltages greater than 100 V; a high frequency switch electrically coupled with the power supply; a nonlinear transmission line electrically coupled with the switch; an antenna electrically coupled with the nonlinear transmission line; and an energy recovery circuit comprising a diode and an inductor electrically coupled with the power supply and the antenna.

17 Claims, 14 Drawing Sheets

US 11,108,384 B2

NONLINEAR TRANSMISSION LINE HIGH VOLTAGE PULSE SHARPENING WITH ENERGY RECOVERY

BACKGROUND

Producing high voltage pulses with fast rise times is challenging. For instance, to achieve a fast rise time (e.g., less than 50 ns) for a high voltage (e.g., greater than 10 kV) pulse, the slope of the pulse rise must be quite steep. Such a steep rise time is very difficult to produce and especially difficult using standard electrical components in a compact manner. It is additionally difficult to produce such a high voltage pulse with fast rise times having variable pulse widths and/or a high pulse repetition rate.

SUMMARY

Some embodiments include a nonlinear transmission line system comprising: a power supply providing voltages greater than 5 kV; a high frequency switch electrically coupled with the power supply; a nonlinear transmission line electrically coupled with the switch; an antenna electrically coupled with the nonlinear transmission line; and an energy recovery circuit comprising a diode and an inductor electrically coupled with the power supply and the antenna.

In some embodiments, the energy recovery circuit is in parallel with the nonlinear transmission line.

In some embodiments, the antenna radiates RF energy. In some embodiments, some energy from the nonlinear transmission line that is not radiated by the antenna is recovered to the power supply.

In some embodiments, the diode is positioned to allow energy to flow from the nonlinear transmission line to the power supply.

In some embodiments, the power supply comprises a capacitor.

In some embodiments, the high frequency switch comprises a high voltage switch.

In some embodiments, the nonlinear transmission line system can further include a high frequency filter.

Some embodiments include a nonlinear transmission line system that includes an energy storage capacitor, a high voltage switch, a nonlinear transmission line, a load, and an energy recovery circuit. The high voltage switch can be electrically coupled with the energy storage capacitor that produces high voltage pulses with a voltage greater than about 1 kV. The nonlinear transmission line can be electrically coupled with the high voltage switch. The load electrically can be coupled with the nonlinear transmission line. The energy recovery circuit can include a diode and an inductor. The energy recovery circuit can be electrically coupled with the energy storage capacitor and the load.

In some embodiments, the high voltage switch comprises a nanosecond pulser.

In some embodiments, the load is an antenna that radiates RF energy.

In some embodiments, the high voltage switch switches with a pulse repetition frequency greater than about 1 kHz.

In some embodiments, the high voltage switch comprises a nanosecond pulser.

Some embodiments include a nonlinear transmission line system that includes an energy storage capacitor, a high voltage switch, a nonlinear transmission line, an antenna, and an energy recovery circuit. The high voltage switch can be electrically coupled with the energy storage capacitor that produces pulses with a voltages greater than about 1 kV. The nonlinear transmission line can be electrically coupled with the high voltage switch that produces an RF signal on the pulses. The antenna can be electrically coupled with the nonlinear transmission line that radiates RF energy from the pulses with the RF signal. The energy recovery circuit can include a diode and an inductor electrically coupled with the power supply and the antenna.

In some embodiments, the nonlinear transmission line produces an RF signal on the pulses.

In some embodiments, the high voltage switch switches with a pulse repetition frequency greater than about 1 kHz.

In some embodiments, the high voltage switch comprises a nanosecond pulser.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
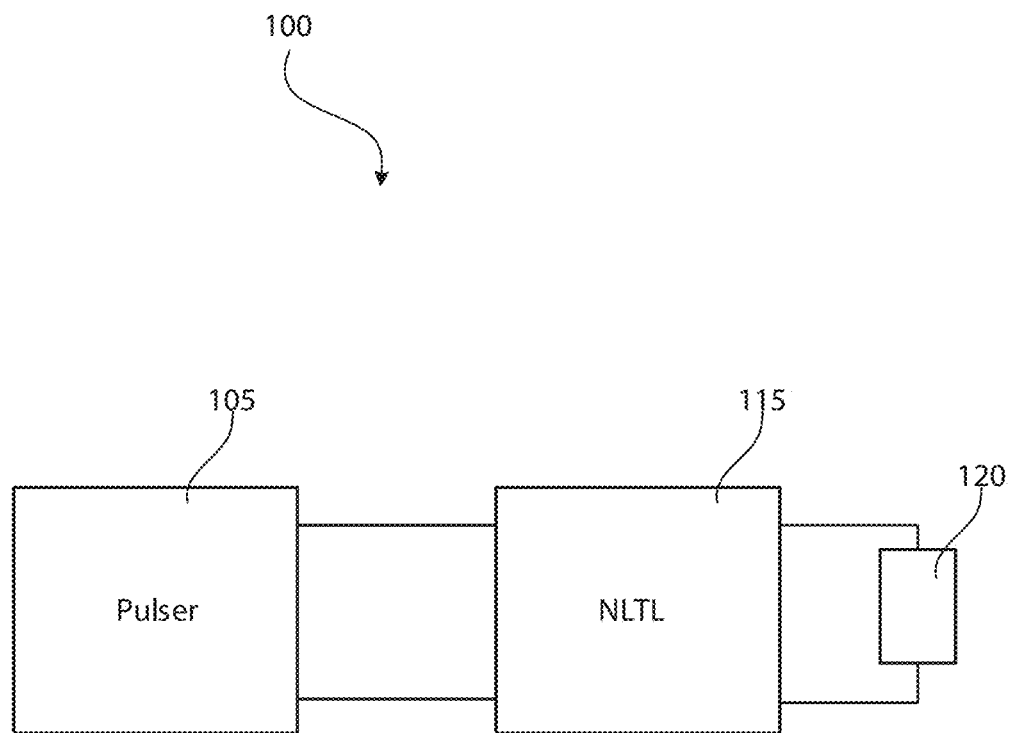
FIG. 1 is a block diagram of a nanosecond pulser and a nonlinear transmission line according to some embodiments.

A nonlinear transmission line with an energy recovery circuit is disclosed. In some embodiments, the nonlinear transmission line may include a plurality of nonlinear semiconductor junction capacitance devices (e.g., nonlinear inductors and/or nonlinear capacitors). In some embodiments, the nonlinear transmission line with an energy recovery circuit may include a high voltage switching power supply that may, for example, include an energy storage capacitor. In some embodiments, the nonlinear transmission line may sharpen the rise time of a high voltage input pulse that may, for example, have a variable pulse width and/or a high pulse repetition rate. In some embodiments, the energy recovery circuit may be electrically coupled with and between a load and an energy storage capacitor. In some embodiments, the energy recovery circuit may be electrically coupled across the nonlinear transmission line.

Some embodiments of the invention include the use of a nonlinear semiconductor junction capacitance device. A nonlinear semiconductor junction capacitance device in some voltage regimes may have a capacitance that varies as voltage across the nonlinear semiconductor junction capacitance device.

A nonlinear semiconductor junction can include a P-type or an N-type junction. A semiconductor junction defined by the boundary between regions of P-type and N-type conductivity material is a capacitor under certain conditions. This junction capacitance arises from the electrical charge of the depletion layer or space-charge region associated with the junction. The space-charge region identifies a volume adjoining the junction on both sides within which the net fixed charge arising from the presence of ionized impurity atoms is not neutralized by mobile charge carriers. Outside of the depletion layer the mobile carriers, holes in the P-type material and electrons in the N-type, are present in almost exactly the right numbers to neutralize the fixed charges.

If the junction is biased slightly in the forward or reverse direction by applying a voltage to a contact on one side of the junction, this voltage urges the hole and electron distributions to move toward or away from each other, respectively. Additional holes and electrons enter or leave the semiconductor at the contacts to maintain the neutrality of the P-type and N-type regions as the depletion layer narrows or widens. Therefore, a certain amount of charge is introduced at the terminals of the device and, neglecting recombination or generation of charge carriers, the same amount of charge returns if the applied voltage is changed back to zero. Thus, the semiconductor junction device is like a capacitor. The relation between the applied voltage and the amount of charge introduced at the terminals is nonlinear; i.e. the capacitance, defined as the rate of change of charge as voltage is changed, depends upon the voltage.

A nonlinear semiconductor junction can also include a metal-semiconductor junction in which a metal is in close contact with a semiconductor material. This close contact between the metal and the semiconductor material can create a junction capacitance that may vary with applied voltage. A metal-semiconductor junction can be referred to as a Schottky barrier diode, Schottky barrier junction, or a point contact diode. A metal-semiconductor junction may include, for example, a metal with either a P-type or an N-type semiconductor region.

In some embodiments, a nonlinear semiconductor junction capacitance (NSJC) device may be a capacitor or a number of plurality of capacitors. In some embodiments, a NSJC device may include two parallel conductors (or a capacitor) etched on a circuit board.

FIG. 1 is a block diagram of a system having a high voltage pulser 105 and a nonlinear transmission line 115 according to some embodiments. The system may or may not also include an output 120 coupled with the output of the nonlinear transmission line 115. In some embodiments, for example, a floating output of the high voltage pulser 105 can be electrically coupled with the nonlinear transmission line 115.

The high voltage pulser 105 may include, for example, a plurality of solid state switches (e.g., IGBTs, MOSFETs, FETs, SiC, GaN switches) and/or a transformer. The high voltage pulser 105 may, for example, be designed and/or constructed with low stray inductance and/or low stray capacitance. The high voltage pulser 105 may, for example, produce high voltage pulses having a fast rise time, a high voltage (e.g., greater than 1 kV), a variable pulse width, a high repetition rate, etc. Any type of high voltage pulser may be used. The high voltage pulser 105 may include the high voltage nanosecond pulser described in U.S. Patent Publication 2015/0130525 and/or U.S. Patent Publication 2015/0318846 the entirety of each of which are incorporated by reference for disclosing a pulser 105.

In some embodiments, the high voltage pulser 105 may, for example, operate with variable pulse widths, voltages greater than 1 kV (or even up to 100 kV), and/or a pulse repetition frequency of 10 kHz-100 kHz.

In some embodiments, the high voltage pulser 105 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the high voltage pulser 105 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the high voltage pulser 105 may operate in a single pulse regime, or in a regime with long pulses.

The nonlinear transmission line 115, for example, may sharpen the rise time of one or more high voltage pulses (e.g., decrease the rise time, speed up the rise time, etc.) produced by the high voltage pulser 105. The sharpened output pulse may have substantially the same high voltage, substantially the same repetition rate, and/or substantially the same variable pulse width as the one or more voltage pulses produced by the high voltage pulser 105. The nonlinear transmission line 115 may include the nonlinear transmission line 200, 300, 400, 500, 600 or some variation thereof.

In some embodiments, the output 120 may produce a high voltage output that has about the same voltage provided by the input (e.g., from the high voltage pulser 105). In some embodiments, an output pulse may have a rise time that is faster than the input rise time. For example, an input pulse may have a voltage of 10 kV and a rise time of 20 ns; the output pulse may have a voltage of 10 kV and a rise time of 10 ns.

Figure 2:
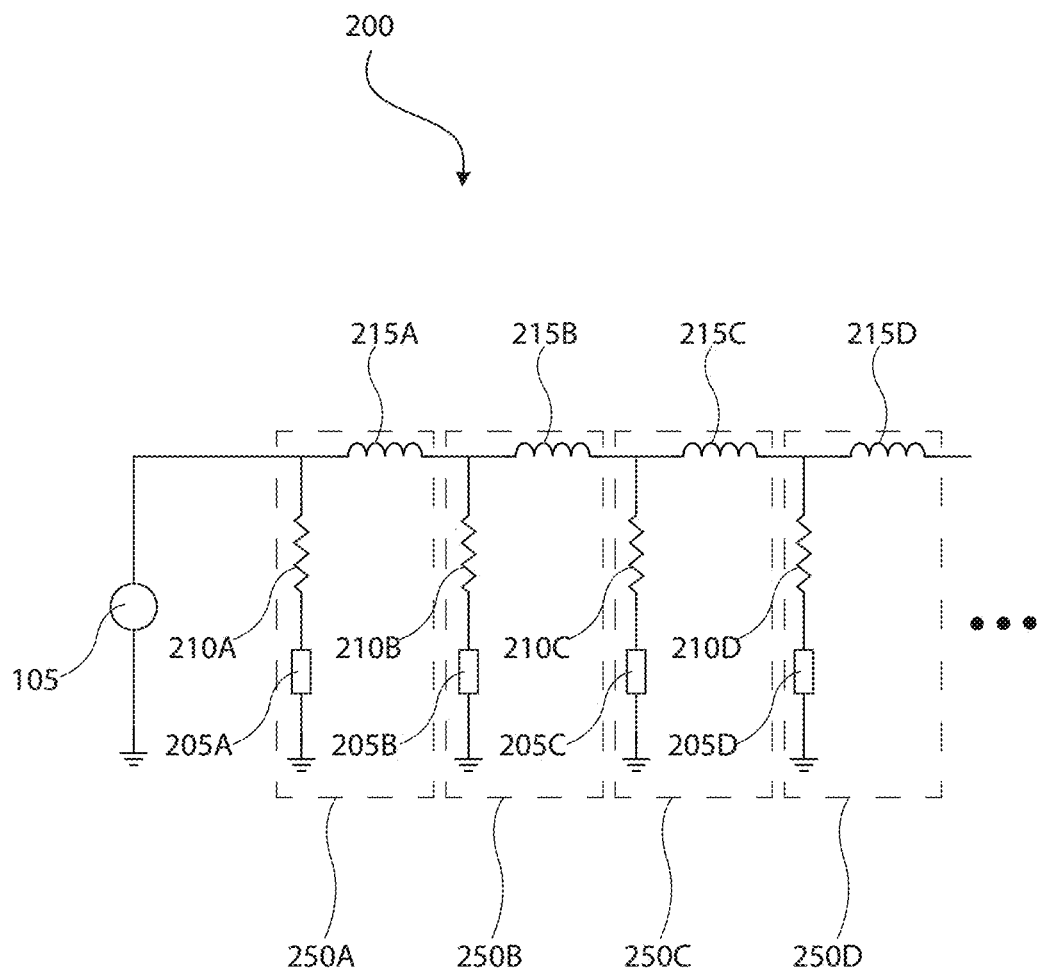
FIG. 2 is a circuit diagram of a nonlinear transmission line according to some embodiments.

FIG. 2 is a circuit diagram of a nonlinear transmission line 200 according to some embodiments. The nonlinear transmission line 200 may include an input that can connect to a high voltage pulser 105. In some embodiments, the nonlinear transmission line 200 can include the high voltage pulser 105.

The nonlinear transmission line 200 includes a first circuit element 250A that includes a first resistor 210A, a first nonlinear semiconductor junction capacitance (NSJC) device 205A, and a first inductor 215A. In some embodiments, the first circuit element 250A may be electrically coupled to both the high voltage pulser 105 and ground.

The nonlinear transmission line 200 includes a second circuit element 250B that includes a second resistor 210B, a second NSJC device 205B, and a second inductor 215B. In some embodiments, the second circuit element 250B may be electrically coupled to both the first inductor 215A and ground.

The nonlinear transmission line 200 includes a third circuit element 250C that includes a third resistor 210C, a third NSJC device 205C, and a third inductor 215C. In some embodiments, the third circuit element 250C may be electrically coupled to both the second inductor 215B and ground.

The nonlinear transmission line 200 includes a fourth circuit element 250D that includes a fourth resistor 210D, a fourth NSJC device 205D, and a fourth inductor 215D. In some embodiments, the fourth circuit element 250D may be electrically coupled to both the third inductor 215C and ground.

The nonlinear transmission line 200 may include an output that can provide a peak voltage that is similar to the peak voltage provided by a high voltage pulser 105 and/or having a rise time that is faster than the rise time of the input.

The nonlinear transmission line 200 shown in FIG. 2 shows four circuit elements (each having a resistor and/or an NSJC device). Any number of circuit elements and/or inductors may be included. For example, a nonlinear transmission line may include five or more circuit elements and/or inductors. As another example, a nonlinear transmission line may include ten or more circuit elements and/or inductors.

In some embodiments, each NSJC device (e.g., NSJC device 205A, 205B, 205C, 205D, etc.) may have an inductance less than about 500 nH, 250 nH, 100 nH. 50 nH, 25 nH, etc. In some embodiments, each NSJC device (e.g., NSJC device 205A, 205B, 205C, 205D, etc.) may include a plurality of NSJC devices in series or parallel.

In some embodiments, each resistor (e.g., resistor 210A, 210B, 210C, 210D, etc.) may have a resistance less than about 1,000 ohms, 500 ohms, 250 ohms, 100 ohms, 50 ohms, 25 ohms, etc. In some embodiments, each resistor (e.g., resistor 210A, 210B, 210C, 210D, etc.) may include a plurality of resistors in series or parallel.

In some embodiments, each inductor (e.g., inductor 215A, 215B, 215C, 215D, etc.) may have an inductance less than about 500 nH, 250 nH, 100 nH. 50 nH, 25 nH, etc. In some embodiments, each inductor (e.g., inductor 215A, 215B, 215C, 215D, etc.) may include a plurality of inductors arranged in series or parallel.

Figure 3:
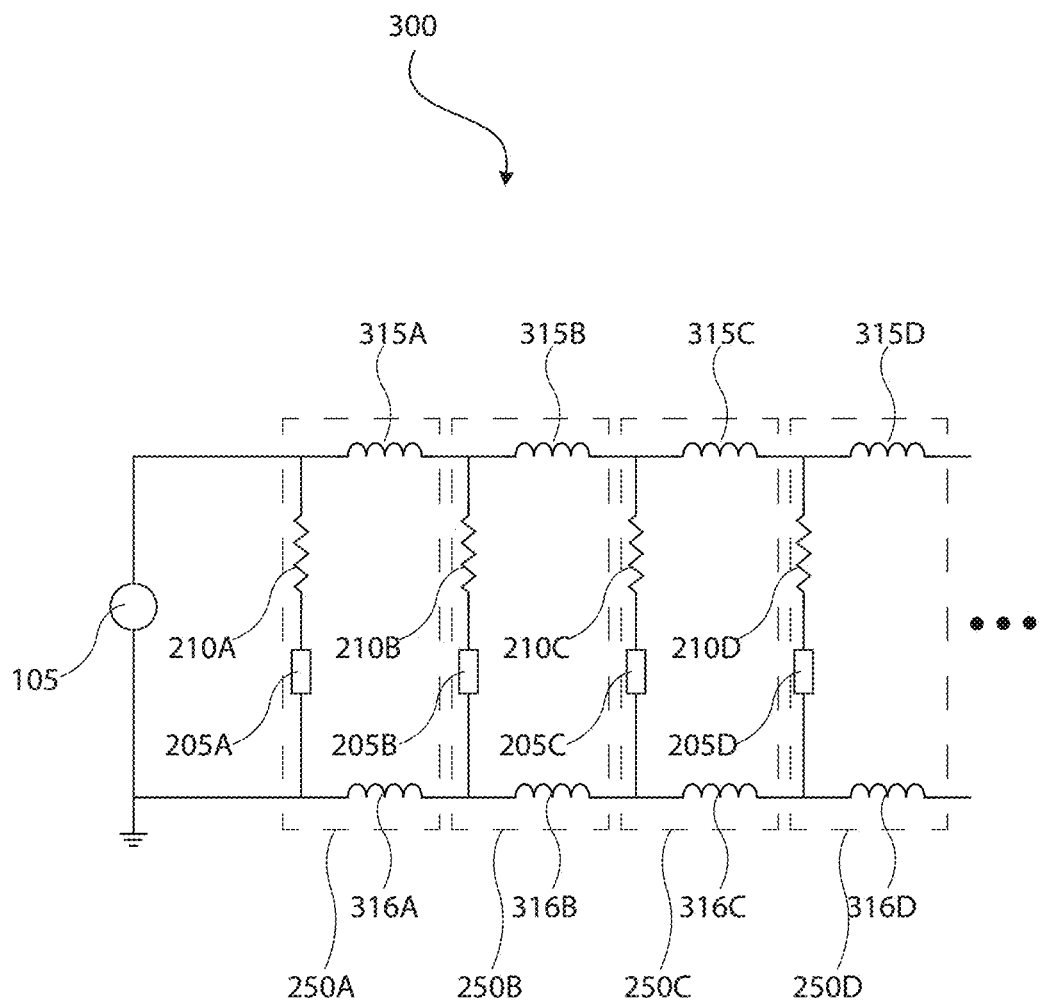
FIG. 3 is a circuit diagram of a nonlinear transmission line according to some embodiments.

FIG. 3 is a circuit diagram of a nonlinear transmission line 300 according to some embodiments. The nonlinear transmission line 300 may include an input that can connect to the high voltage pulser 105 as described in FIG. 1 and/or FIG. 2. In some embodiments, the nonlinear transmission line 300 can include the high voltage pulser 105. The nonlinear transmission line 300 may be similar to the nonlinear transmission line 200, in this example the nonlinear transmission line 300 includes two inductors between circuit elements rather than one inductor.

The nonlinear transmission line 300 includes a first circuit element 250A that includes a first resistor 210A, a first nonlinear semiconductor junction capacitance (NSJC) device 205A, a first upper inductor 315A, and a first lower inductor 316A. In some embodiments, the first circuit element 250A may be electrically coupled to both the high voltage pulser 105 and ground.

The nonlinear transmission line 300 includes a second circuit element 250B that includes a second resistor 210B, a second NSJC device 205B, a second upper inductor 315B, and a second lower inductor 316B. In some embodiments, the second circuit element 250B may be electrically coupled to both the first upper inductor 315A and the first lower inductor 316A.

The nonlinear transmission line 300 includes a third circuit element 250C that includes a third resistor 210C, a third NSJC device 205C, a third upper inductor 315C and a third lower inductor 316C. In some embodiments, the third circuit element 250C may be electrically coupled to both the second upper inductor 315B and the second lower inductor 316B.

The nonlinear transmission line 300 includes a fourth circuit element 250D that includes a fourth resistor 210D, a fourth NSJC device 205D, a fourth upper inductor 315D, and a fourth lower inductor 316D. In some embodiments, the fourth circuit element 250D may be electrically coupled to both the third upper inductor 315C and the third lower inductor 316C.

The nonlinear transmission line 300 may include an output that can provide a peak voltage that is similar to the peak voltage provided by the high voltage pulser 105 and/or having a rise time that is faster than the rise time of the input.

The nonlinear transmission line 300 shown in FIG. 3 shows four circuit elements (each having a resistor and an NSJC device). Any number of circuit elements and/or inductors may be included. For example, a nonlinear transmission line may include five or more circuit elements and/or inductors. As another example, a nonlinear transmission line may include ten or more circuit elements and/or inductors.

In some embodiments, each NSJC device (e.g., NSJC device 205A, 205B, 205C, 205D, etc.) may have an inductance less than about 500 nH, 250 nH, 100 nH. 50 nH, 25 nH, etc. In some embodiments, each NSJC device (e.g., NSJC device 205A, 205B, 205C, 205D, etc.) may include a plurality of NSJC devices in series or parallel. In some embodiments, each NSJC device (e.g., NSJC device 205A, 205B, 205C, 205D, etc.) may have a capacitance less than about 10 nF, 5 nF, 2.5 nF, 1 nF, etc.

In some embodiments, each resistor (e.g., resistor 210A, 210B, 210C, 210D, etc.) may have a resistance less than about 1,000 ohms, 500 ohms, 250 ohms, 100 ohms, 50 ohms, 25 ohms, etc. In some embodiments, each resistor (e.g., resistor 210A, 210B, 210C, 210D, etc.) may include a plurality of resistors in series or parallel.

In some embodiments, each inductor (e.g., inductor 315A, 315B, 315C, 315D, 316A, 316B, 316C, 316D, etc.) may have an inductance less than about 500 nH, 250 nH, 100 nH. 50 nH, 25 nH, 10 nH, etc. In some embodiments, each inductor (e.g., inductor 315A, 315B, 315C, 315D, 316A, 316B, 316C, 316D, etc.) may include a plurality of inductors arranged in series or parallel.

Figure 4:
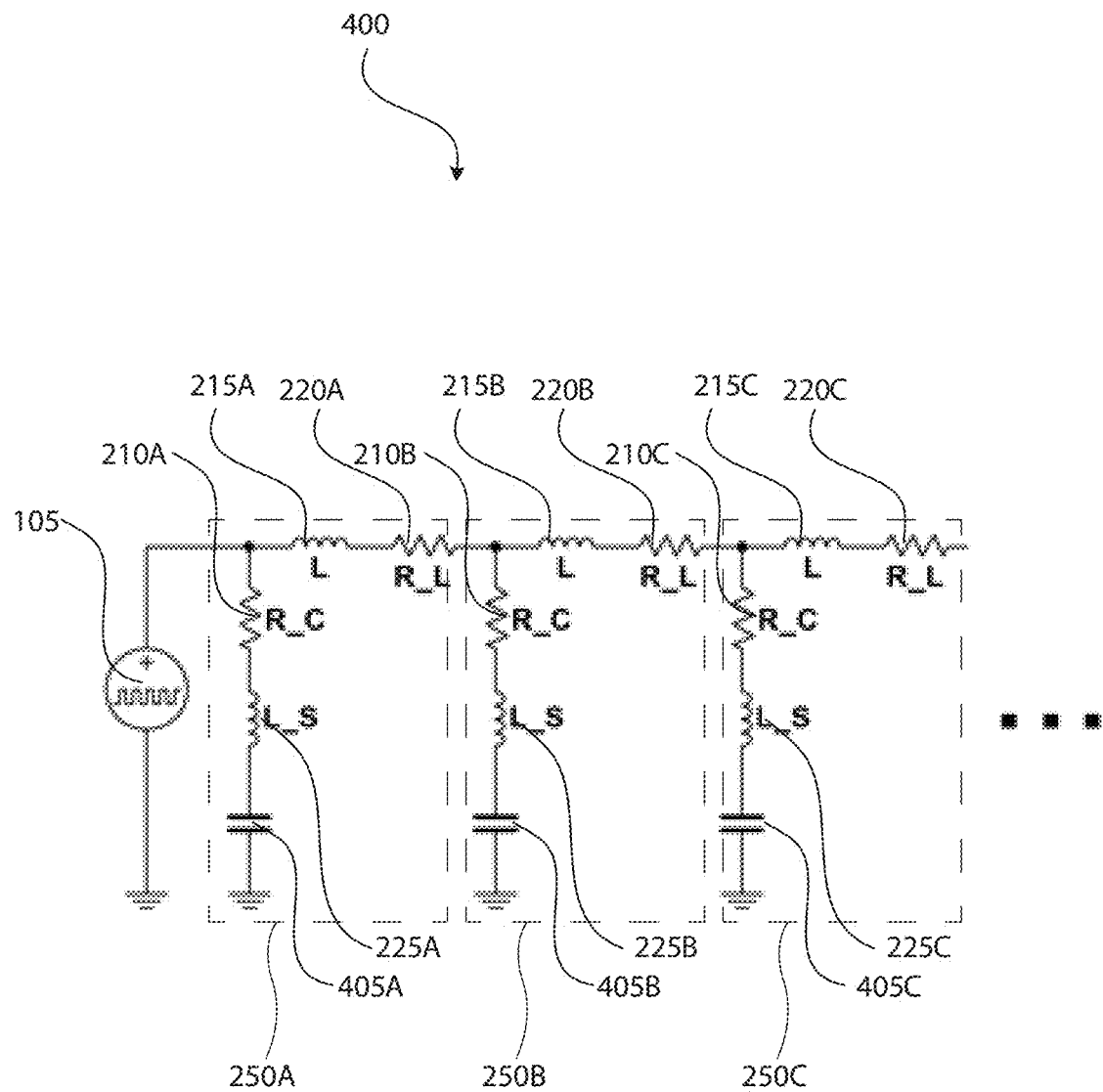
FIG. 4 is a circuit diagram of a nonlinear transmission line according to some embodiments.

FIG. 4 is a circuit diagram of a nonlinear transmission line 400 according to some embodiments. The circuit diagram of the nonlinear transmission line 400 shows a number of stray elements such as stray resistance represented as a resistor and stray inductance represented as an inductor.

In some embodiments, the nonlinear transmission line 400 may include a plurality of NSJC devices 405A, 405B, 405C. Because the nonlinear capacitance of the NSJC devices is being exploited, the NSJC devices are schematically represented as a capacitor in FIG. 4. In some embodiments, the nonlinear transmission line 400 may include a plurality of circuit elements that each include a resistor (e.g., one of resistors 210A, 210B, 210C) and a resistor (e.g., a respective one of resistors 210A, 210B, 210C), for example, may be electrically coupled in series with a NSJC device (e.g., a respective one of the plurality of NSJC devices 405A, 405B, 405C). In some embodiments, the transmission line 400 may include a plurality of inductors 215A, 215B, 215C. Each one of the plurality of inductors, for example, may be electrically coupled with two circuit elements and/or a circuit element and an output.

While the transmission line 400 shown in FIG. 4 shows three circuit elements any number of circuit elements may be used. In some embodiments, each NSJC device 405A, 405B, or 405C may include one or more NSJC devices in series or parallel (e.g., 2, 3, 5, 7, 9, 12, 15 NSJC devices arranged in series), which may, for example, provide for a NSJC device combination with sufficient operating voltage such as, for example, a combined operating voltage greater than 500 V, 1 kV, 2.5 kV, 5 kV, 10 kV, etc. In some embodiments, an NSJC device may include a diode such as, for example, silicon carbide Schottky diode(s), silicon diode (s), or other diode(s). In some embodiments, each NSJC device 405A, 405B, 405C may include a semiconductor device that has a nonlinear capacitance as a function of junction voltage.

Each NSJC device 405A, 405B, 405C (or combination of NSJC devices), for example, may have a voltage ratings of more than 1.0 kV such as, for example, 1.1, 1.2, 1.3, 1.4, 1.5, 1.6, 1.8, 1.9, 2.0, 2.1, 2.2, 2.3, 3.4 kV. In some embodiments, each NSJC device 405A, 405B, 405C (or combination of NSJC devices) may have a stray inductance 225A, 225B, 225C less than about 1,000 nH, 750 nH, 500 nH, 250 nH, 100 nH, 50 nH, 30 nH, 20 nH, 15 nH, 10 nH, etc.

While the nonlinear transmission line 400 shown in FIG. 4 shows three resistors 210A, 210B, 210C in parallel with each other, any number of resistors may be used for each respective resistors 210A, 210B, 210C. In some embodiments, the resistors 210A, 210B, 210C may have a resistance of less than about 1,000 ohms, 500 ohms, 250 ohms, 100 ohms, 50 ohms, etc.

While the nonlinear transmission line 400 shown in FIG. 4 shows three inductors 215A, 215B, 215C any number of inductors may be used. The inductors, for example, may have an inductance of less than about 250 nH, 100 nH, 50 nH, 25 nH, 10 nH, etc.

The nonlinear transmission line 400 may include an high voltage pulser 105. The input, for example, may be coupled with a nanosecond pulser. The input, in some embodiments, may be coupled with one or more additional nonlinear transmission lines.

In some embodiments, the nonlinear transmission line 400 may be coupled with a nanosecond pulser that can produce a high voltage pulse train with a plurality of pulses. The high voltage pulse train produced by the nanosecond pulser may have any number of characteristics such as, for example, having a voltage such as, for example, above 1 kV, 2.5 kV, 5 kV, 10 kV, 15 kV, 20 kV, etc.; and a fast rise time such as, for example, a rise time less than about 50 ns, 40 ns, 30 ns, 20 ns, 10 ns, etc. The plurality of pulses of the high voltage pulse train may, for example, have variable pulse widths (e.g., 3-275 ns).

In some embodiments, the nonlinear transmission line 400 may reduce the rise time of the high voltage pulse train while maintaining the variable pulse widths and/or the pulse repetition frequency of the input high voltage pulse train. For example, the nonlinear transmission line 400 may output a high voltage pulse train having, for example, a high voltage, a reduced rise time (e.g., reduced by 20 ns), and a variable pulse width (e.g., 3-275 ns) corresponding to the variable pulse width produced from the nanosecond pulser.

Figure 5:
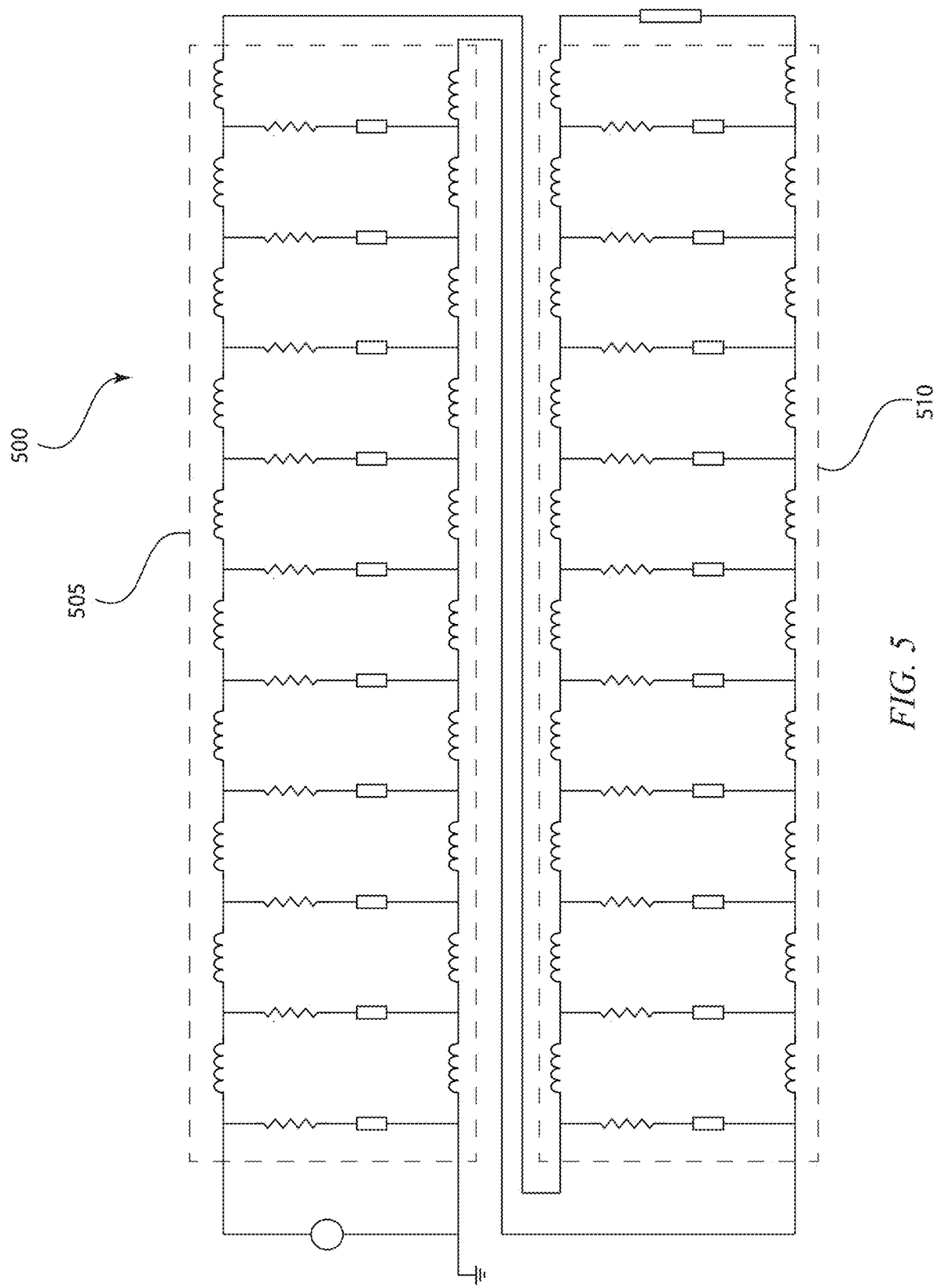
FIG. 5 is a circuit diagram of a nonlinear transmission line that includes any number of series combinations of NSJC devices.
Figure 6:
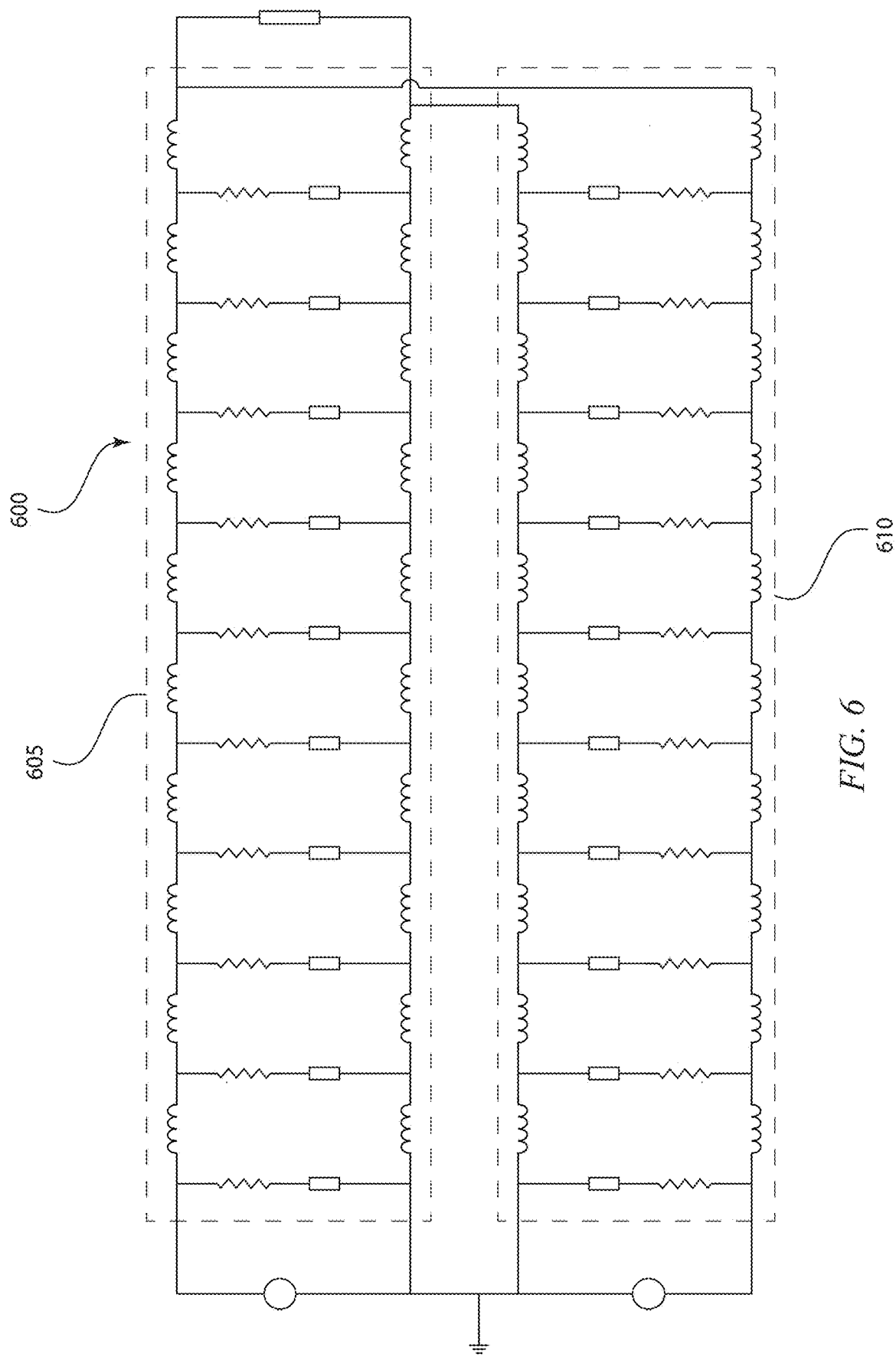
FIG. 6 is a circuit diagram of a nonlinear transmission line that includes any number of series combinations of NSJC devices.

The nonlinear transmission line 400 may include any number of series combinations of NSJC devices and/or any number of series combinations of resistors in parallel with an inductor. FIG. 5 and FIG. 6 illustrate some examples.

The nonlinear transmission line 400 may be described as having a plurality of circuit elements. For example, FIG. 4 illustrates three circuit elements. The first circuit element 250A includes the first NSJC device 205A having first stray inductance 225A, the first resistor 210A, and the first inductor 215A with first stray resistance 220A. The second circuit element 250B includes the second NSJC device 205B having second stray inductance 225B, the second resistor 210B, and the second inductor 215B with second stray resistance 220B. The third circuit element 250C includes the third NSJC device 205C having third stray inductance 225C, the third resistor 210C, and the third inductor 215C with third stray resistance 220C. The first circuit element 250, the second circuit element 250B, and the third circuit element 250C may be arranged in parallel. The nonlinear transmission line 400 may include any number of circuit elements arranged in parallel. The number of circuit elements may be determined based on the increase to the rise time of a pulse as described in more detail below.

FIG. 5 is a circuit diagram of two nonlinear transmission lines 500 arranged in series according to some embodiments. The first nonlinear transmission line 505 includes 10 circuit elements and the second nonlinear transmission line 510 includes 10 circuit elements. Any number of circuit elements may be included in either nonlinear transmission line. Any number of nonlinear transmission lines may be arranged in series. A high voltage pulser 105 drives the two nonlinear transmission lines 500.

FIG. 6 is a circuit diagram of two nonlinear transmission lines 600 arranged in parallel according to some embodiments. The first nonlinear transmission line 605 includes 10 circuit elements and the second nonlinear transmission line 610 includes 10 circuit elements. Any number of circuit elements may be included in either nonlinear transmission line. Any number of high voltage pulsers 105 may drive the first nonlinear transmission line 605. Another high voltage pulser 105 may drive the second nonlinear transmission line 610. Both first nonlinear transmission line 605 and the second nonlinear transmission line 610 are coupled to the same load.

In some embodiments, the plurality of inductors of a nonlinear transmission line may have inductances that vary. For example, the inductance of inductors further from the input (e.g., the high voltage pulser 105) may have an inductance lower than inductors closer to the input. As another example, the inductance of inductors further from the input (e.g., the high voltage pulser 105) may have an inductance higher than inductors closer to the input.

In some embodiments, the plurality of resistors of a nonlinear transmission line may have resistances that vary. For example, the resistance of resistors further from the input (e.g., the high voltage pulser 105) may have a resistance lower than resistors closer to the input. As another example, the resistance of resistors further from the input (e.g., the high voltage pulser 105) may have a resistance higher than resistors closer to the input.

In some embodiments, the plurality of NSJC devices of a nonlinear transmission line may have capacitances that vary. For example, the capacitance of NSJC devices further from the input (e.g., the high voltage pulser 105) may have a capacitance lower than NSJC devices closer to the input. As another example, the capacitance of NSJC devices further from the input (e.g., the high voltage pulser 105) may have a capacitance higher than NSJC devices closer to the input.

Figure 7:
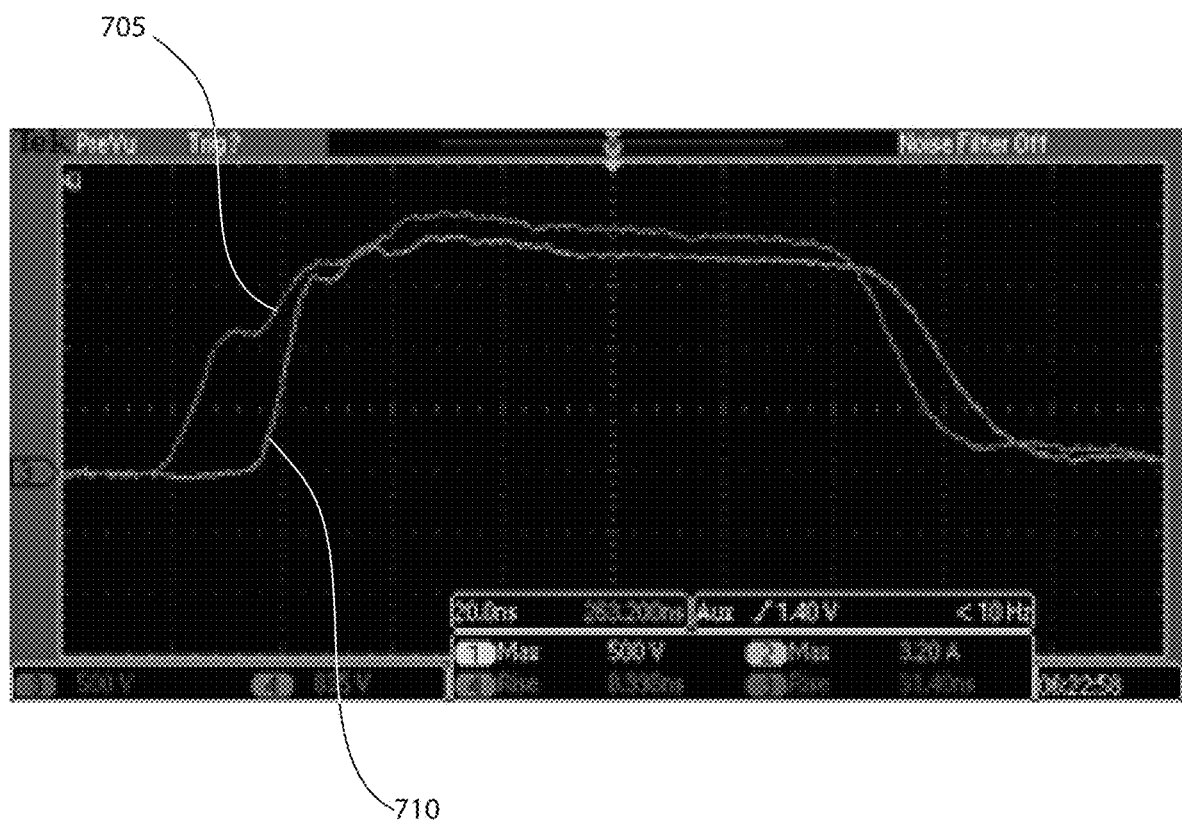
FIG. 7 illustrates an input pulse waveform and an output waveform of a nonlinear transmission line.

FIG. 7 illustrates an input pulse 705 and an output pulse 710 of a nonlinear transmission line that was designed not to produce RF signals or radiation. As shown in FIG. 7, the output pulse 710 has a steeper and/or faster and/or sharper rise time. In particular, in this example, the input waveform has a 33 ns rise time and the output waveform has a 9 ns rise time, which has been sharpened by the nonlinear transmission line. In addition, in this example, the output pulse has a pulse width that is substantially the same as the pulse width of the input pulse. The flat top voltage in this example may be about 10 kV. The nonlinear transmission line in this example, can be said to have sharpened the rise time, while maintaining the high voltage of the input pulse and pulse width of the input pulse.

In some embodiments, the high voltage pulser 105 may include a nanosecond pulser and/or may provide a high voltage pulse to the input of a nonlinear transmission line 200. The nanosecond pulser may provide a pulse that has a rise time such as, for example, a rise time less than about 250 ns, 200 ns, 150 ns, 100 ns, 50 ns, 30 ns, 20 ns, 10 ns, 5 ns, 1 ns, etc. The output of the nonlinear transmission line 400 may provide an output from the input pulse that has a rise time that is less than about 10 ns, 20 ns, 30 ns, 40 ns, 50 ns, etc. faster than the input rise time. For example, if the input pulse has a 50 ns rise time, the output pulse may have a 20 ns rise time.

An example of a reduced rise time between the input pulse and the output pulse or a nonlinear transmission line is shown in FIG. 7. A waveform of the input pulse 705 is shown next to a waveform of the output pulse 710. As shown in the figure, the rise time of the input pulse 705 is longer than the rise time of the output pulse 710. In this example, the input rise time is 31 ns and the output rise time has been compressed to 9 ns.

The rise time may be measured, for example, as the amount of time it takes for the pulse to rise from 10% to 90% of the peak voltage.

The high voltage input or high voltage output pulse, for example, may have a voltage greater than about 1 kV, 5 kV, 10 kV, 15 kV, 20 kV, 30 kV, 50 kV, 100 kV, etc. The high voltage input or high voltage output pulse, for example, may have a variable pulse width. The high voltage pulse, for example, may have a pulse width that is greater than 1 ns, 2 ns, 5 ns, 10 ns, 20 ns, 50 ns, 100 ns, 250 ns, 500 ns, etc. The high voltage input or high voltage output pulse, for example, may have an adjustable pulse repetition rate. The high voltage input or high voltage output pulse, for example, may have a pulse repetition rate greater than 50 kHz, 100 kHz, 250 kHz, 500 kHz, 1,000 kHz, etc.

In some embodiments, a nonlinear transmission line can include a NSJC device that has the following capacitance:

$$C(V) = \frac{C_{j0}}{(1+V/\varphi)^m}.$$

Where $C_{j0}$ is the junction capacitance of the NSJC at zero voltage. V is the voltage. $\varphi$ is the junction potential. m is a constant value between 0.25 and 0.75 that varies based on the type of NSJC.

In some embodiments, the overall capacitance of a Schottky diode, which may be used as a NSJC device, may be inversely proportional to the number of diodes (e.g., diode, resistor, and inductor combinations) are included in the nonlinear transmission line, for example:

$$C_s = \frac{1}{n} \frac{C_{j0}}{\sqrt{1+V_s/n\varphi}}.$$

This equation may be used for Schottky diodes, and may not necessarily be used for all NSJC devices.

In some embodiments, the overall capacitance, $C_s$, of the nonlinear transmission line will decrease with increased number of diode (or NSJC device) sections n. $C_{j0}$ is the junction capacitance at zero voltage of a single diode, $\varphi$ is the junction potential and $V_s$ is the voltage across the nonlinear transmission line.

In some embodiments, as a general rule of thumb, in some conditions, the characteristic impedance of the nonlinear transmission line 400 may be less than about 180 ohms. In some embodiments, the inductance of the nonlinear transmission line can be calculated, for example, to impedance match to 180Ω using the following formula, where $V_{40\%}$ is 40% of $V_{max}$:

$$Z = \sqrt{\frac{L}{C(V_{40\%})}}.$$

In some embodiments, the impedance of the nonlinear transmission line 400 may vary as a function of the voltage applied and/or, for example, time, as the input pulse is applied.

In some embodiments, the value of resistors 210A, 210B, 210C may be calculated to critically damp out any ringing from a stray inductance 225A, 225B, 225C and/or any variable capacitance of the NSJC devices 405A, 405B, 405C. In an ideal nonlinear transmission line, for example, with no stray inductance 225A, 225B, 225C, the rise time may be limited by the Bragg frequency. However, in many example embodiments, the stray inductance may limit the rise time. The resonant rise time may be calculated using $C(V_{max})$ and $C(V_{40\%})$ to provide two different reference points.

In some embodiments, as a general rule, the amount of change to the rise time for the nonlinear transmission line 400 may be determined from $$\Delta t \approx \sqrt{LC_{10\%}} - \sqrt{LC_{90\%}}.$$

From this equation and the equation for the overall capacitance, $C_s$, described above, the number of diode sections, N, can be determined to achieve a desired rise time, Δt.

Each nonlinear transmission line, for example, could be used to reduce rise times down a step. For instance, one from 10 ns to 5 ns and the second from 5 ns to 2 ns and so on. Each could be made to be optimized for the specific step it's taking.

Figure 8:
FIGS. 8 and 9 are waveforms having high pulse repetition frequencies.

FIG. 8 illustrates a nonlinear transmission line receiving an input pulse train with a pulse repetition frequency of 100 kHz and producing a corresponding output pulse train with a pulse repetition frequency of 100 kHz. In addition, the voltage of the output can be the same as the input voltage.

In the example shown in FIG. 8, a voltage divider was included at the output, which lowered the voltage as shown in the figure. The voltage divider is not required.

Figure 9:
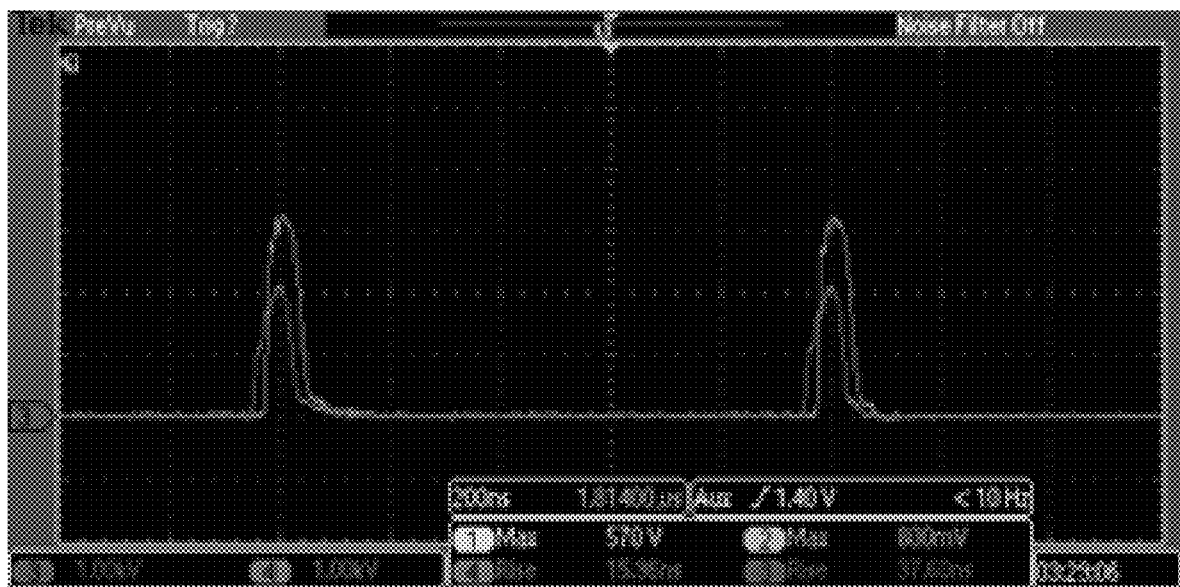

FIG. 9 illustrates a nonlinear transmission line receiving an input pulse train with a pulse repetition frequency of 1,000 kHz and producing a corresponding output pulse train with a pulse repetition frequency of 1,000 kHz. In the waveforms shown in FIG. 8 and FIG. 9 the pulse width is about 100 ns. In addition, the voltage of the output can be the same as the input voltage. In the example shown in FIG. 9, a voltage divider was included at the output, which lowered the voltage as shown in the figure. The voltage divider is not required.

Figure 10:
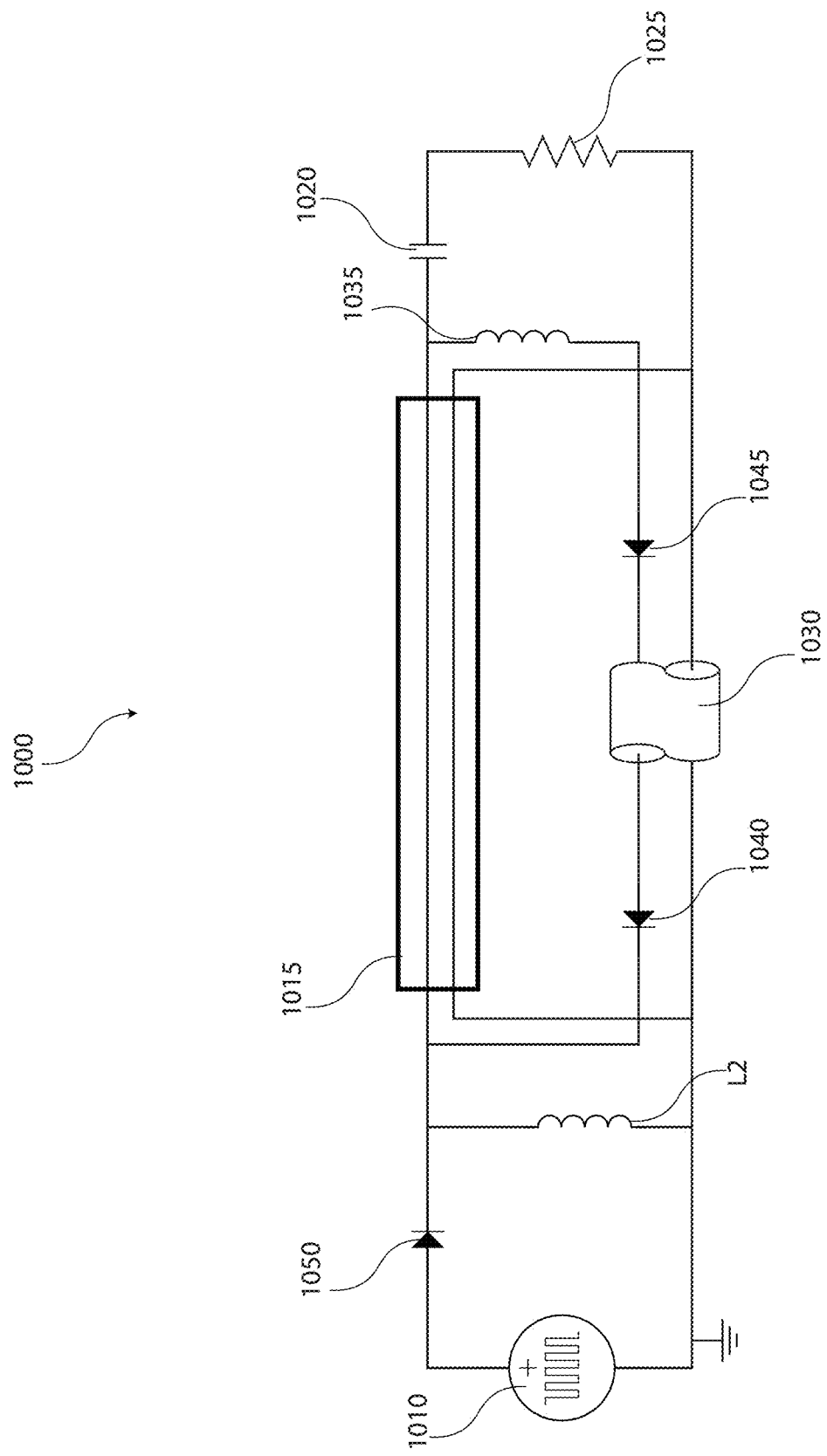
FIG. 10 is a circuit diagram of a nonlinear transmission line with a pulse generator according to some embodiments.

FIG. 10 is a circuit diagram of a nonlinear transmission line 1030 with a pulse recycling according to some embodiments. The pulse generator 1010 (e.g., a nanosecond pulser) can produce square pulses. In some embodiments, the pulse generator 1010 can produce pulses with pulses of 50, 100, 500, 1,000, 5,000, 10,000, etc. volts. The nonlinear transmission line (NLTL) 1015 (e.g., nonlinear transmission line 200, 300, 400, 500, 600 or some variation thereof) can produce RF waveforms on top of the square pulse. In some embodiments, the nonlinear transmission line 1015 can be gyromagnetic, diode-based, ferrite-based, lumped element, etc. In some embodiments, the nonlinear transmission line 1015 can have nonlinear inductance and/or capacitance. The capacitor 1020 can filter high frequencies from the pulses. The load 1025 can represent an antenna that can radiate the RF waveforms.

In some embodiments, pulses can move along the transmission line 1030 and can pass through the NLTL 1015 again to radiate more energy. The inductor 1035 can be sized to prevent the NLTL 1015 from staying charged over long time scales. The diode 1040 and the diode 1045 may ensure current flows through the transmission line 1030 back through the NLTL 1015. The diode 1050 ensures current flows from the pulse generator 1010 to the diode 1050.

Figure 11:
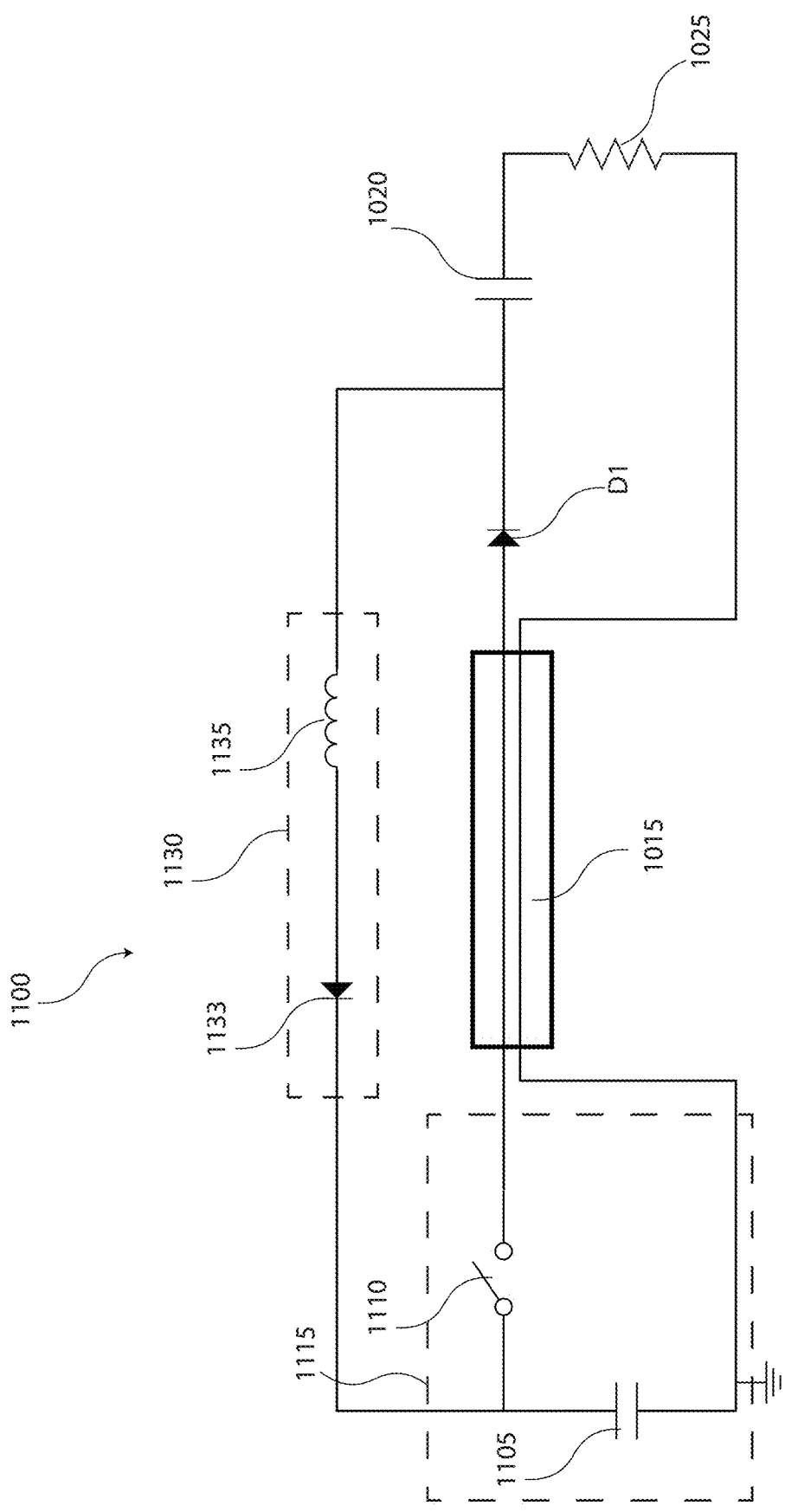
FIG. 11 is a circuit diagram of a nonlinear transmission line and an energy recovery circuit according to some embodiments.

FIG. 11 is a circuit diagram of a nonlinear transmission line 1100 and an energy recovery circuit 1130 according to some embodiments. The energy storage capacitor 1105 can include an energy storage capacitor that can be charge from an external source. In some embodiments, the energy storage capacitor 1105 can produce pulses with pulses of 50, 100, 500, 1,000, 5,000, 10,000, etc. volts. The switch 1110 can include any high voltage switch that can open and close at high frequencies such as, for example, the high voltage switch 1400. The switch 1110 may include a photoconductive semiconductor switch (PCSS), a series stacked solid-state switch (e.g., IGBTs, MOSFETs, thrystor, etc.), a spark-gap switch, an inductive adder, etc.

In some embodiments, the switch 1110 and/or the energy storage capacitor 1105 can include a switching power supply 1115. The switching power supply 1115, for example, may include a nanosecond pulser. The switching power supply 1115, for example, may include any power supply that can produce pulses with an amplitude greater than about 1 kV, 5 kV, 10 kV, 20 kV, etc. and/or with a pulse repetition frequency greater than about 1 kHz, 10 kHz, 25 kHz, 50 kHz, 100 kHz, etc.

In some embodiments, the switching power supply 1115 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the switching power supply 1115 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

The NLTL 1015 (e.g., nonlinear transmission line 200, 300, 400, 500, 600 or some variation thereof) can produce an RF signal on top of the square pulse. In some embodiments, the NLTL 1015 can be gyromagnetic, diode-based, ferrite-based, lumped element, etc. In some embodiments, the NLTL 1015 can have nonlinear inductance and/or capacitance. The capacitor 1020 can filter high frequencies from the pulses. The load 1025, for example, can represent an antenna that can radiate RF energy.

The energy recovery circuit 1130 can include energy recovery diode 1133 and energy recovery inductor 1135 and/or may be arranged in parallel with the NLTL 1015 and/or the switch 1110. Energy that is not radiated from the load 1025 can be recovered through the energy recovery circuit 1130. The energy recovery diode 1133 can be arranged to allow energy to flow into the energy storage capacitor 1105. The energy recovery inductor 1135, for example, can be selected so that the pulses have fast rise or fall times.

In some embodiments, the energy recovery inductor 1135 may have an inductance greater then about 10 µH, 50 µH, 100 µH, 500 µH, etc. In some embodiments, the energy recovery inductor 1135 may have an inductance of about 1µH to about 100 mH.

In some embodiments, an NLTL transmission line with an energy recovery circuit 1130 can increase efficiency by 50%. For example, the energy storage capacitor 1105 can provide 8.5 mJ of input energy and the load 1025 can dissipate 0.23 mJ. The energy recovery circuit can recover 4.4 mJ of energy that can charge the energy storage capacitor 1105. The RF efficiency can more than double the efficiency of similar circuits without an energy recovery circuit.

Figure 12:
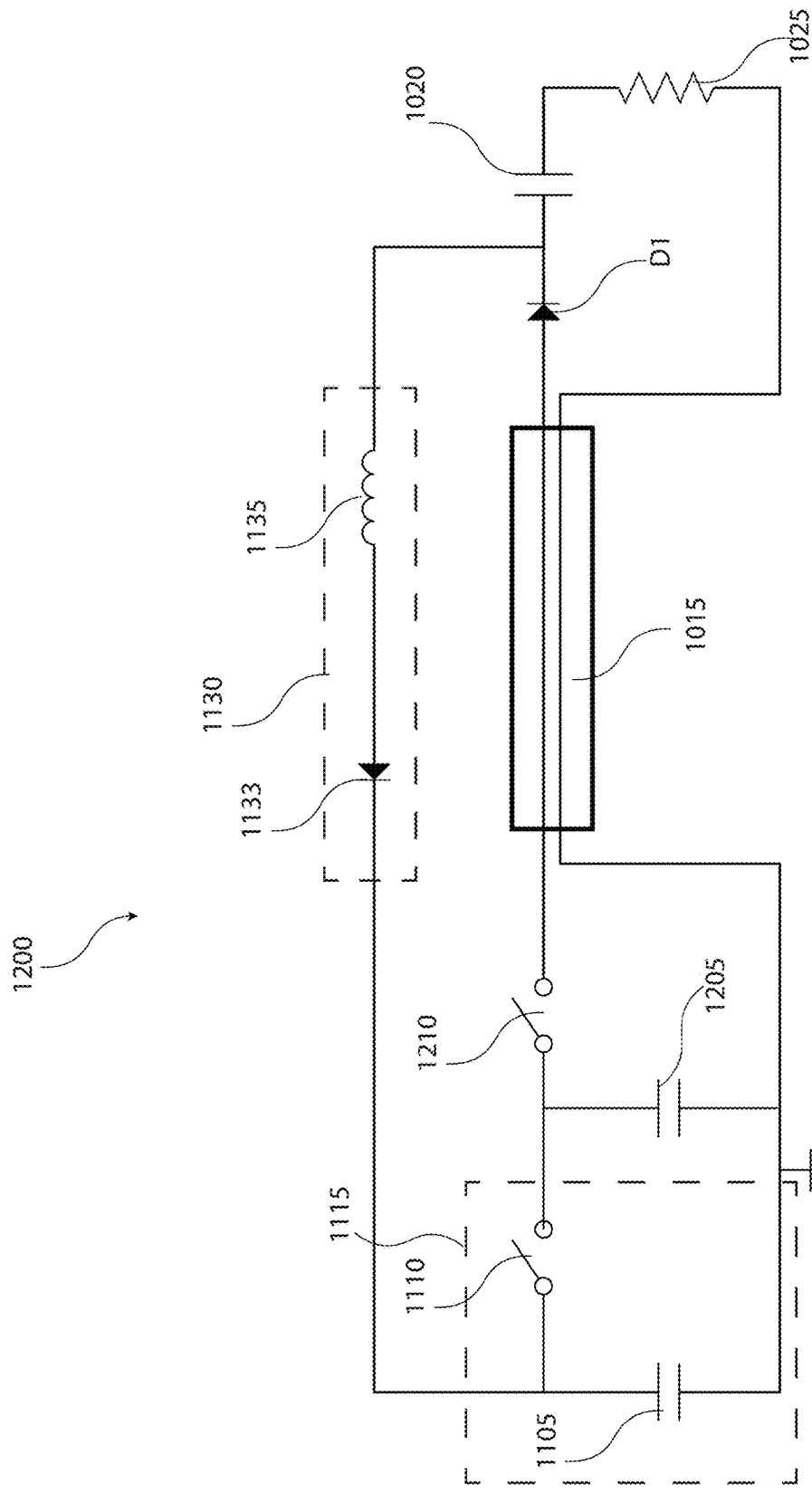
FIG. 12 is a circuit diagram of a nonlinear transmission line and an energy recovery circuit according to some embodiments.

FIG. 12 is a circuit diagram of a nonlinear transmission line and an energy recovery circuit 1200 according to some embodiments. The energy storage capacitor 1205 can include any energy storage capacitor that can be charged from the energy storage capacitor 1105 such as, for example, when the switch 1110 is closed and the high voltage switch 1210 is open. In some embodiments, the energy storage capacitor 1205 and the switch 1210 can produce pulses with pulses of 50, 100, 500, 1,000, 5,000, 10,000, etc. volts. Pulses may be created by opening and closing the switch 1210. The switch 1210 may include a photoconductive semiconductor switch (PCSS), a series stacked solid-state switch (e.g., IGBTs, MOSFETs, thrystor, etc.), a spark-gap switch, an inductive adder, etc. In some embodiments, the switch 1210 may include the high voltage switch 1400.

In some embodiments, the energy storage capacitor 1105 can include a pulse charger that charges the energy storage capacitor 1205 when the switch 1110 is closed. The switch 1210 may include a photoconductive semiconductor switch (PCSS), a series stacked solid-state switch (e.g., IGBTs, MOSFETs, thrystor, etc.), a spark-gap switch, an inductive adder, etc. The energy storage capacitor 1105 can be charged from an external power supply as well as from the energy recovery circuit 1130.

The NLTL 1015 (e.g., nonlinear transmission line 200, 300, 400, 500, 600 or some variation thereof) can produce RF on top of the square pulse. In some embodiments, the NLTL 1015 can be gyromagnetic, diode-based, ferrite-based, lumped element, etc. In some embodiments, the NLTL 1015 can have nonlinear inductance and/or capacitance. The capacitor 1020 can filter high frequencies from the pulses. Load 1025 can represent an antenna that can radiate the RF.

The energy recovery circuit 1130 can include energy recovery diode 1133 and energy recovery inductor 1135 and/or may be arranged in parallel with the NLTL 115 and/or the switch 1110. Energy that is not radiated from load 1025 can be recovered through the energy recovery circuit 1130. Energy recovery diode 1133 can be arranged to allow energy not dissipated at the load 1025 to flow from into the energy storage capacitor 1105. The energy recovery inductor 1135, for example, can be selected so that the pulses have fast rise or fall times.

Figure 13:
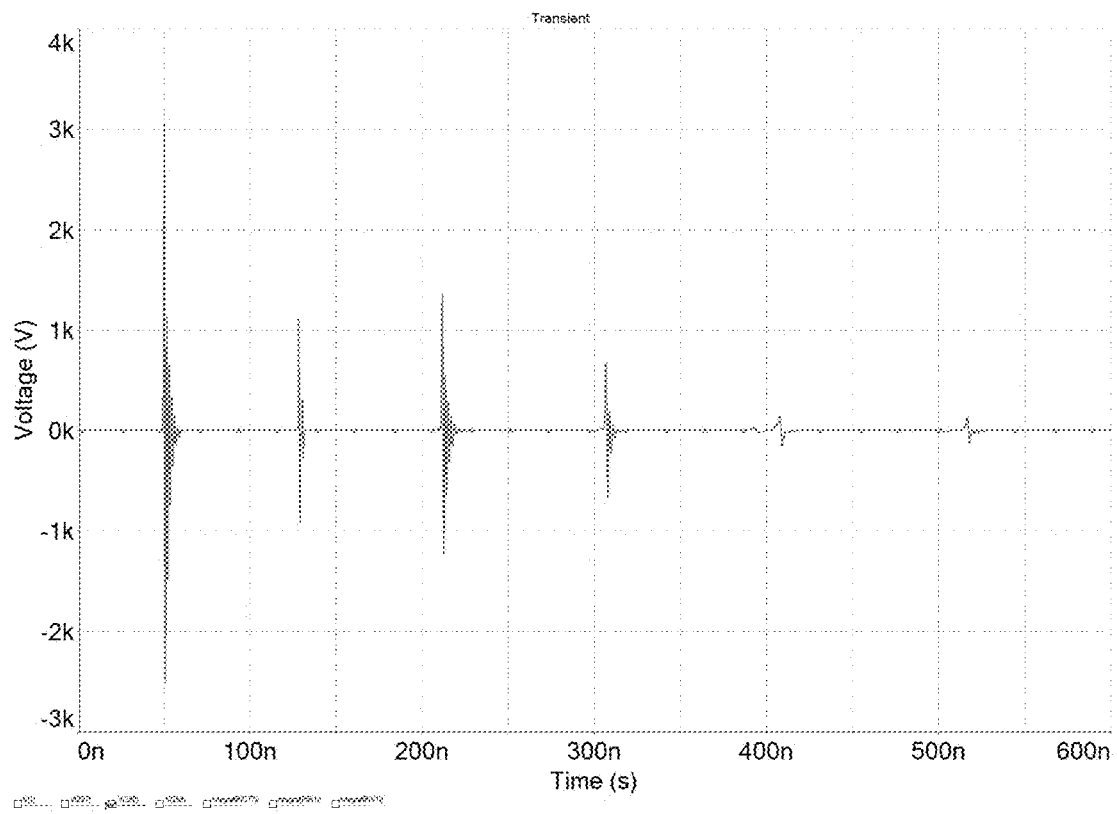
FIG. 13 illustrates output pulse waveforms from the nonlinear transmission line according to some embodiments.

FIG. 13 illustrates output pulse waveforms from the nonlinear transmission line and an energy recovery circuit 1200 according to some embodiments.

Figure 14:
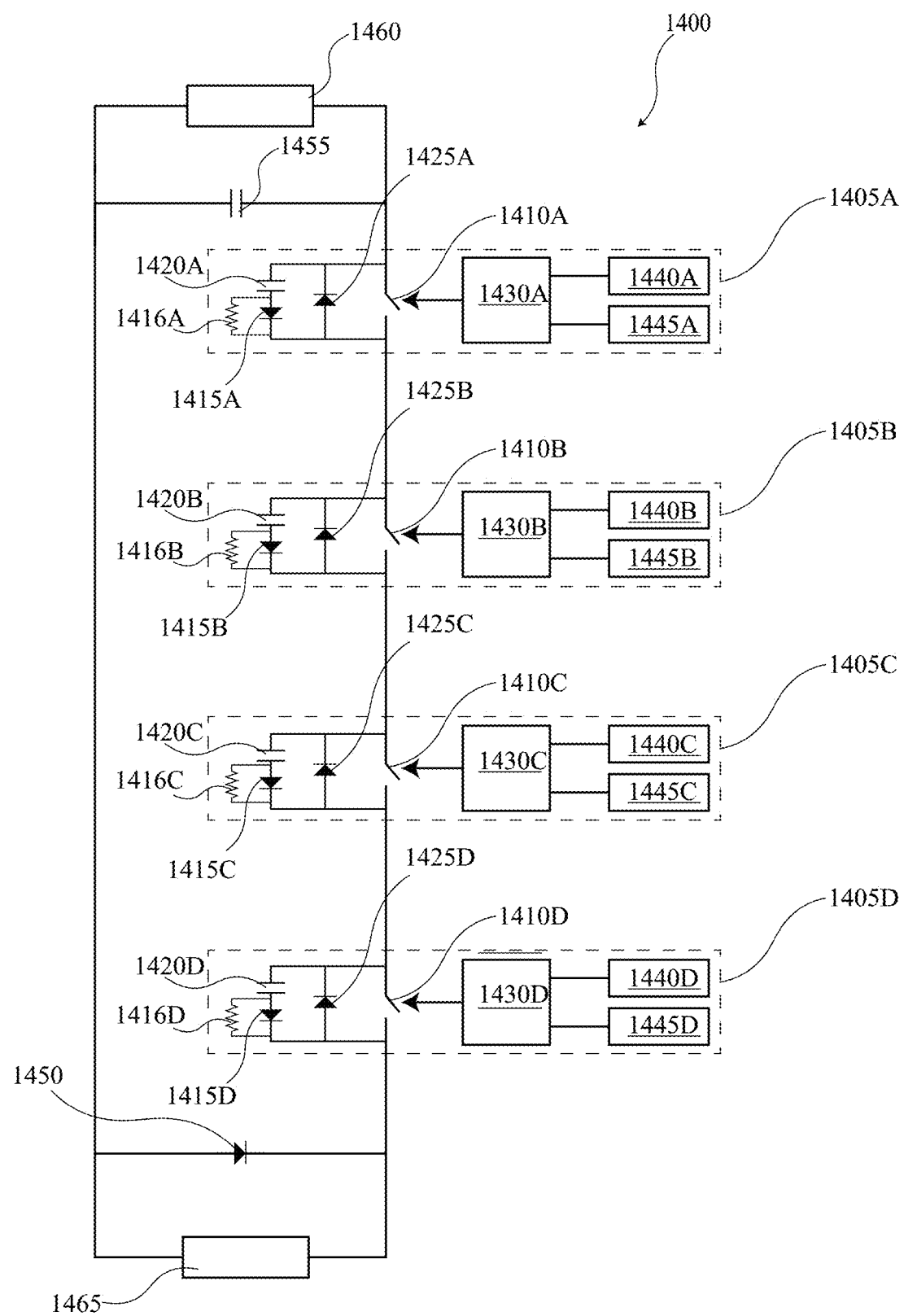
FIG. 14 is a block diagram of a high voltage switch according to some embodiments.

FIG. 14 is a block diagram of a high voltage switch 1400 with isolated power according to some embodiments. The high voltage switch 1400 may include a plurality of switch modules 1405 (collectively or individually 1405, and individually 1405A, 1405B, 1405C, and 1405D) that may switch voltage from a high voltage source 1460 with fast rise times and/or high frequencies and/or with variable pulse widths. Each switch module 1405 may include a switch 1410 such as, for example, a solid state switch.

In some embodiments, the switch 1410 may be electrically coupled with a gate driver circuit 1430 that may include a power supply 1440 and/or an isolated fiber trigger 1445 (also referred to as a gate trigger or a switch trigger). For example, the switch 1410 may include a collector, an emitter, and a gate (or a drain, a source, and a gate) and power supply 1440 may drive the gate of the switch 1410 via the gate driver circuit 1430. The gate driver circuit 1430 may, for example, be isolated from the other components of the high voltage switch 1400.

In some embodiments, the power supply 1440 may be isolated, for example, using an isolation transformer. The isolation transformer may include a low capacitance transformer. The low capacitance of the isolation transformer may, for example, allow the power supply 1440 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 140 V AC transformer. Regardless, the isolation transformer can provide isolated power from other components in the high voltage switch 1400. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 1440 may include any type of power supply that can provide high voltage standoff (isolation) or have low capacitance (e.g., less than about 1,000 pF, 100 pF, 10 pF, etc.). In some embodiments, the control voltage power source may supply 1420 V AC or 240 V AC at 60 Hz.

In some embodiments, each power supply 1440 may be inductively electrically coupled with a single control voltage power source. For example, the power supply 1440A may be electrically coupled with the power source via a first transformer; the power supply 1440B may be electrically coupled with the power source via a second transformer; the power supply 1440C may be electrically coupled with the power source via a third transformer; and the power supply 1440D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 1440A, the power supply 1440B, the power supply 1440C, and/or the power supply 1440D may not share a return reference ground or a local ground.

The isolated fiber trigger 1445, for example, may also be isolated from other components of the high voltage switch 1400. The isolated fiber trigger 1445 may include a fiber optic receiver that allows each switch module 1405 to float relative to other switch modules 1405 and/or the other components of the high voltage switch 1400, and/or, for example, while allowing for active control of the gates of each switch module 1405.

In some embodiments, return reference grounds or local grounds or common grounds for each switch module 1405, for example, may be isolated from one another, for example, using an isolation transformer.

Electrical isolation of each switch module 1405 from common ground, for example, can allow multiple switches to be arranged in a series configuration for cumulative high voltage switching. In some embodiments, some lag in switch module timing may be allowed or designed. For example, each switch module 1405 may be configured or rated to switch 1 kV, each switch module may be electrically isolated from each other, and/or the timing of closing each switch module 1405 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 1410 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 1410 may include any type of solid state switching device such as, for example, an IGBT, a MOSFET, a SiC MOSFET, SiC junction transistor, FETs, SiC switches, GaN switches, photoconductive switch, etc. The switch 1410, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns) and/or with long pulse lengths (e.g., greater than about 10 ms). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 1400 shown in FIG. 14 includes four switch modules 1405. While four are shown in this figure, any number of switch modules 1405 may be used such as, for example, two, eight, twelve, sixteen, twenty, twenty-four, etc. For example, if each switch in each switch module 1405 is rated at 1400 V, and sixteen switches are used, then the high voltage switch can switch up to 19.2 kV. As another example, if each switch in each switch module 1405 is rated at 1700 V, and sixteen switches are used, then the high voltage switch can switch up to 27.2 kV.

In some embodiments, the high voltage switch 1400 may switch voltages greater than 5 kV, 10 kV, 14 kV, 20 kV, 25 kV, etc.

In some embodiments, the high voltage switch 1400 may include a fast capacitor 1455. The fast capacitor 1455, for example, may include one or more capacitors arranged in series and/or in parallel. These capacitors may, for example, include one or more polypropylene capacitors. The fast capacitor 1455 may store energy from the high voltage source 1460.

In some embodiments, the fast capacitor 1455 may have low capacitance. In some embodiments, the fast capacitor 1455 may have a capacitance value of about 1 µF, about 5 µF, between about 1 µF and about 5 µF, between about 100 nF and about 1,000 nF etc.

In some embodiments, the high voltage switch 1400 may or may not include a crowbar diode 1450. The crowbar diode 1450 may include a plurality of diodes arranged in series or in parallel that may, for example, be beneficial for driving inductive loads. In some embodiments, the crowbar diode 1450 may include one or more Schottky diodes such as, for example, a silicon carbide Schottky diode. The crowbar diode 1450 may, for example, sense whether the voltage from the switches of the high voltage switch is above a certain threshold. If it is, then the crowbar diode 1450 may short the power from switch modules to ground. The crowbar diode, for example, may allow an alternating current path to dissipate energy stored in the inductive load after switching. This may, for example, prevent large inductive voltage spikes. In some embodiments, the crowbar diode 1450 may have low inductance such as, for example, 1 nH, 10 nH, 100 nH, etc. In some embodiments, the crowbar diode 1450 may have low capacitance such as, for example, 100 pF, 1 nF, 10 nF, 100 nF, etc.

In some embodiments, the crowbar diode 1450 may not be used such as, for example, when the load 1465 is primarily resistive.

In some embodiments, each gate driver circuit 1430 may produce less than about 1000 ns, 100 ns, 10.0 ns, 5.0 ns, 3.0 ns, 1.0 ns, etc. of jitter. In some embodiments, each switch 1410 may have a minimum switch on time (e.g., less than about 10 µs, 1 µs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 1405 may have the same or substantially the same (±5%) stray inductance. Stray inductance may include any inductance within the switch module 1405 that is not associated with an inductor such as, for example, inductance in leads, diodes, resistors, switch 1410, and/or circuit board traces, etc. The stray inductance within each switch module 1405 may include low inductance such as, for example, an inductance less than about 300 nH, 100 nH, 10 nH, 1 nH, etc. The stray inductance between each switch module 1405 may include low inductance such as, for example, an inductance less than about 300 nH, 100 nH, 10 nH, 1 nH, etc.

In some embodiments, each switch module 1405 may have the same or substantially the same (±5%) stray capacitance. Stray capacitance may include any capacitance within the switch module 1405 that is not associated with a capacitor such as, for example, capacitance in leads, diodes, resistors, switch 1410 and/or circuit board traces, etc. The stray capacitance within each switch module 1405 may include low capacitance such as, for example, less than about 1,000 pF, 100 pF, 10 pF, etc. The stray capacitance between each switch module 1405 may include low capacitance such as, for example, less than about 1,000 pF, 100 pF, 10 pF, etc.

Imperfections in voltage sharing can be addressed, for example, with a passive snubber circuit (e.g., the snubber diode 1415, the snubber capacitor 1420, and/or the freewheeling diode 1425). For example, small differences in the timing between when each of the switches 1410 turn on or turn off or differences in the inductance or capacitances may lead to voltage spikes. These spikes can be mitigated by the various snubber circuits (e.g., the snubber diode 1415, the snubber capacitor 1420, and/or the freewheeling diode 1425).

A snubber circuit, for example, may include a snubber diode 1415, a snubber capacitor 1420, a snubber resistor 1416, and/or a freewheeling diode 1425. In some embodiments, the snubber circuit may be arranged together in parallel with the switch 1410. In some embodiments, the snubber capacitor 1420 may have low capacitance such as, for example, a capacitance less than about 100 pF.

The term "substantially" means within 5% or 10% of the value referred to or within manufacturing tolerances.

The term "or" is inclusive.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A nonlinear transmission line system comprising:
a power supply providing voltages greater than 100 V;
a switch electrically coupled with the power supply;

a nonlinear transmission line electrically coupled with the switch;

an antenna electrically coupled with the nonlinear transmission line; and an energy recovery circuit comprising a diode and an inductor electrically coupled with the power supply and the antenna.

2. The nonlinear transmission line system according to claim 1, wherein the energy recovery circuit is in parallel with the nonlinear transmission line.

3. The nonlinear transmission line system according to claim 1, wherein the antenna radiates RF energy.

4. The nonlinear transmission line system according to claim 1, wherein some energy from the nonlinear transmission line that is not radiated by the antenna is recovered to the power supply.

5. The nonlinear transmission line system according to claim 1, wherein the diode is positioned to allow energy to flow from the antenna and/or the nonlinear transmission line to the power supply.

6. The nonlinear transmission line system according to claim 1, wherein the power supply comprises an energy storage capacitor.

7. The nonlinear transmission line system according to claim 1, further comprising a high frequency filter coupled with the antenna and/or the nonlinear transmission line.

8. The nonlinear transmission line system according to claim 1, further comprising a second power supply and a second switch, wherein the energy recovery circuit charges the second power supply.

9. The nonlinear transmission line system according to claim 1, wherein the switch switches with a pulse repetition frequency greater than about 1 kHz.

10. A nonlinear transmission line system comprising:
an energy storage capacitor;
a high voltage switch electrically coupled with the energy storage capacitor that produces high voltage pulses with a voltage greater than about 1 kV;
a nonlinear transmission line electrically coupled with the high voltage switch;
a load electrically coupled with the nonlinear transmission line; and
an energy recovery circuit comprising a diode and an inductor, the energy recovery circuit is electrically coupled with the energy storage capacitor and the load.

11. The nonlinear transmission line system according to claim 10, wherein the high voltage switch comprises a nanosecond pulser.

12. The nonlinear transmission line system according to claim 10, wherein the load is an antenna that radiates RF energy.

13. The nonlinear transmission line system according to claim 10, wherein the high voltage switch switches with a pulse repetition frequency greater than about 1 kHz.

14. A nonlinear transmission line system comprising:
an energy storage capacitor;
a high voltage switch electrically coupled with the energy storage capacitor that produces pulses with a voltages greater than about 1 kV;
a nonlinear transmission line electrically coupled with the high voltage switch that produces an RF signal on the pulses;
an antenna electrically coupled with the nonlinear transmission line that radiates RF energy from the pulses with the RF signal; and
an energy recovery circuit comprising a diode and an inductor electrically coupled with the power supply and the antenna.

15. The nonlinear transmission line system according to claim 14, wherein the nonlinear transmission line produces an RF signal on the pulses.

16. The nonlinear transmission line system according to claim 14, wherein the high voltage switch switches with a pulse repetition frequency greater than about 1 kHz.

17. The nonlinear transmission line system according to claim 14, wherein the high voltage switch comprises a nanosecond pulser.

* * * * *